(12) United States Patent
Kim

(10) Patent No.: US 7,560,369 B2
(45) Date of Patent: Jul. 14, 2009

(54) METHOD OF FORMING METAL LINE IN SEMICONDUCTOR DEVICE

(75) Inventor: Jea-Hee Kim, Gyunggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 105 days.

(21) Appl. No.: 11/473,008

(22) Filed: Jun. 21, 2006

(65) Prior Publication Data

US 2006/0292867 A1    Dec. 28, 2006

(30) Foreign Application Priority Data

Jun. 22, 2005    (KR)    ...................... 10-2005-0053999

(51) Int. Cl.
    *H01L 21/44*    (2006.01)
(52) U.S. Cl. .................. 438/597; 438/905; 438/906; 257/E21.224; 257/E21.228; 257/E21.229
(58) Field of Classification Search ................ 438/905, 438/906, 58, 115, 143, 310, 402, 471, 597; 257/E21.224, E21.225, E21.226, E21.227, 257/E21.228, E21.229, E21.579

See application file for complete search history.

(56) References Cited

U.S. PATENT DOCUMENTS

| 6,677,251 B1* | 1/2004 | Lu et al. ...................... 438/778 |
| 6,890,391 B2* | 5/2005 | Aoki et al. .................... 134/32 |
| 2004/0152305 A1* | 8/2004 | Yiu et al. ..................... 438/685 |
| 2005/0121059 A1* | 6/2005 | Boyd et al. ............... 134/102.3 |
| 2005/0136678 A1* | 6/2005 | Chou et al. ................. 438/706 |

* cited by examiner

*Primary Examiner*—Ha Tran T Nguyen
*Assistant Examiner*—Daniel Whalen
(74) *Attorney, Agent, or Firm*—The Law Offices of Andrew D. Fortney; Andrew D. Fortney; William K. Nelson

(57) ABSTRACT

The present invention provides a method of forming metal lines in a semiconductor device having advantages of preventing an "explosion" phenomenon during a dual damascene process so as to improve the yield of the device. An exemplary embodiment of the present invention includes removing etching residues by wet cleaning the semiconductor substrate after forming the via hole, dry cleaning the semiconductor substrate after the wet cleaning, and forming a second metal line that is electrically connected with the first metal line through the via hole.

17 Claims, 4 Drawing Sheets

METHOD OF FORMING METAL LINE IN SEMICONDUCTOR DEVICE

CROSS-REFERENCE TO RELATED APPLICATION

This application claims priority to and the benefit of Korean Patent Application No. 10-2005-0053999, filed in the Korean Intellectual Property Office on Jun. 22, 2005, the entire contents of which are incorporated herein by reference.

BACKGROUND OF THE INVENTION (a) Field of the Invention

The present invention relates to a method of manufacturing a semiconductor device. More particularly, the present invention relates to a method of forming metal lines in a semiconductor device that can prevent or reduce the likelihood of corrosion of the metal during a cleaning process.

(b) Description of the Related Art

Generally, the metal materials that are most frequently used in semiconductor manufacturing processes are aluminum and aluminum alloys. This is because aluminum and aluminum alloys have high electric conductivity and good adherence to an oxide layer, and they are easily formed.

However, aluminum and aluminum alloys have some drawbacks such as electro-migration, hillocks, and spiking.

When an electric current is flowed in an aluminum line used for metal wiring, aluminum atoms in a current concentrating region, such as a contacting area with a silicon layer, or a step-shaped region are easily diffused into other regions. Consequently, the aluminum line may become narrower and broken, and this phenomenon is called electro-migration. Electro-migration occurs by electrons diffusing little by little, and so it occurs after considerable operating time.

In order to overcome such drawbacks, an aluminum-copper alloy where a small quantity of copper (e.g., 0.5-2.0 wt. %) is added to aluminum can be used, and the resulting aluminum line may have improved step coverage and an enlarged contact area.

Another problem may happen in an alloying process. That is, a junction spike phenomenon may occur where silicon atoms in the substrate diffuse into an overlying aluminum layer during heat treatment.

The junction spike phenomenon can be suppressed by using an aluminum-silicon alloy that is formed by adding excess silicon or by forming a diffusion barrier including a thin metal (e.g., TiW or PtSi) layer between an aluminum layer and a silicon substrate.

Accordingly, an alternative material for the metal lines has been demanded. A high conductive metal, such as copper (Cu), gold (Au), silver (Ag), cobalt (Co), chrome (Cr), and nickel (Ni), can be a candidate for the alternative material. Among these metals, copper and copper alloys are widely adopted owing to low resistivity, high reliability against electro-migration and stress-migration, and low manufacturing cost.

The copper and copper alloys are deposited into a via hole (or a contact hole) and a trench in a dual damascene structure and polished by chemical mechanical polishing so as to form a copper line. However, the copper line is easily oxidized and dissolved by a slurry used in a chemical mechanical polishing process, so it is difficult to be planarized.

A conventional method of forming a metal line in a semiconductor device will hereinafter be described in detail with reference to the accompanying drawings.

FIG. 1A to FIG. 1D are cross-sectional views showing principal stages of forming a conventional metal line in a semiconductor device.

As shown in FIG. 1A, a first insulation layer 12 is formed on a semiconductor substrate 11, and a first conductive layer (e.g., a copper layer) is formed thereon. Subsequently, the first conductive layer is selectively etched by a photo and etching process so as to form a first metal line 13.

A second insulation layer 14 is formed on the entire surface of the semiconductor substrate 11 including the first metal line 13, and a first photosensitive layer 15 is coated on the second insulation layer 14. Subsequently, the first photosensitive layer 15 is selectively patterned by an exposure and development process so as to define a contact region. The patterned first photosensitive layer 15 is used as an etching mask in selectively etching the second insulation layer 14 to expose a part of the surface of the first metal line 13, thereby forming a via hole 16.

As shown in FIG. 1B, after the first photosensitive layer 15 is removed, a second photosensitive layer 17 is coated on the semiconductor substrate 11 and patterned by an exposing and developing process so as to define a wiring region. Subsequently, the exposed second insulation layer 14 is selectively etched by using the patterned second photosensitive layer 17 as an etching mask so as to form a trench 18 having a predetermined depth. The trench 18 is located on the via hole 16 and has a greater width than the via hole 16 so as to form a dual damascene structure.

In forming the trench 18 and the via hole 16, etching residues 19 are unavoidably generated.

As shown in FIG. 1C, after removing the second photosensitive layer 17, a dry cleaning process is performed over the semiconductor substrate 11 provided with the trench 18 and the via hole 16 so as to remove the etching residues 19.

A single wafer type cleaning apparatus is generally used for the cleaning process. The cleaning process using the single wafer cleaning apparatus generally has a better cleaning ability than another cleaning process (e.g., a batch wafer cleaning apparatus and/or a wet cleaning process) using deionized (DI) water.

In using the single wafer type cleaning apparatus, a wafer is rotated at a high RPM (e.g., 100-2000RPM) and accelerated. In addition, a chemical, such as a nitrogen ($N_2$) gas, is sprayed onto the wafer so as to remove the etching residues 19 in the trench 18 and the via hole 16.

As shown in FIG. 1D, after the cleaning process, a conductive barrier layer 20 and a second conductive layer 21 (e.g., a copper layer) are sequentially formed over the entire surface of the semiconductor substrate 11 including in the trench 18 and the via hole 16. Subsequently, a chemical mechanical polishing (CMP) process is performed over the semiconductor substrate 11 in order to remove the second conductive layer 21 and the barrier layer 20 from areas outside the via hole 16 and the trench 18, and leave the second conductive layer 21 and the barrier layer 20 in the via hole 16 and the trench 18.

According to the conventional method, during the process of spraying a chemical at high RPM in the single wafer type cleaning apparatus, a high level of static electricity may be generated in a region of the apparatus and/or wafer, wherein charges are locally increased, and the first metal line 13 may "explode" (or otherwise become catastrophically damaged).

The explosion phenomenon cannot be found by a general in-line inspection tool, and so it can only be found after completing the process of forming the device. This can be a serious factor in deteriorating the yield of the device.

The above information disclosed in this Background section is only for enhancement of understanding of the background of the invention, and therefore, it may contain information that does not form prior art knowledge or other form of prior art that may be already known in this or another country to a person of ordinary skill in the art.

SUMMARY OF THE INVENTION

The present invention has been made in an effort to provide a method of forming a metal line in a semiconductor device having advantages of preventing an explosion phenomenon of the metal line during a dual damascene process and/or to improve the yield of the device.

An exemplary embodiment of the present invention provides a method of forming metal lines in a semiconductor device including forming a first metal line on a semiconductor substrate, forming an insulation layer on the entire surface of the semiconductor substrate including the first metal line, exposing a part of the surface of the first metal line by selectively removing the insulation layer so as to form a via hole, removing etching residues by wet cleaning the semiconductor substrate after forming the via hole, dry cleaning the semiconductor substrate after the wet cleaning, and forming a second metal line that is electrically connected with the first metal line through the via hole.

DETAILED DESCRIPTION OF THE EMBODIMENTS

Figure 1A:
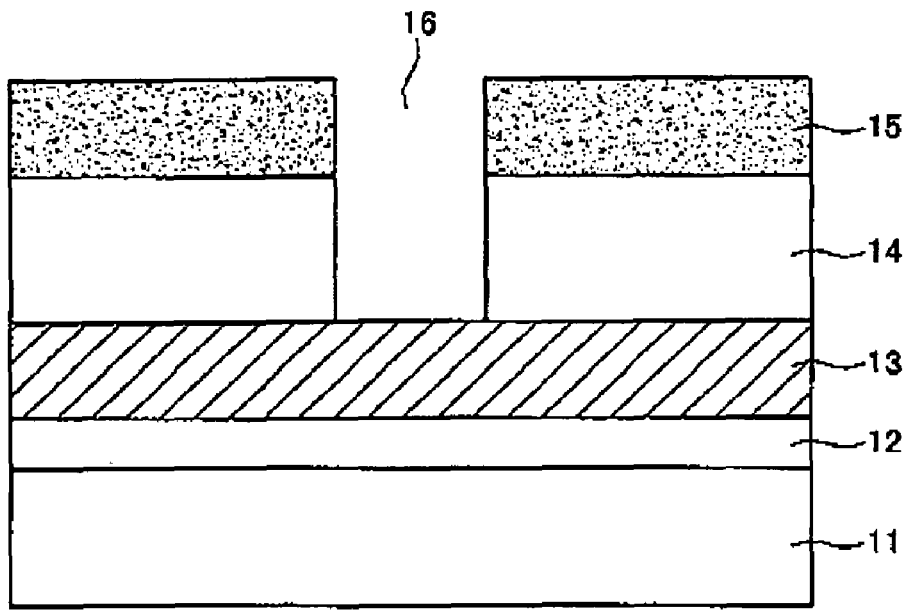
FIG. 1A to FIG. 1D are cross-sectional views showing principal stages of forming a conventional metal line in a semiconductor device.
Figure 1B:
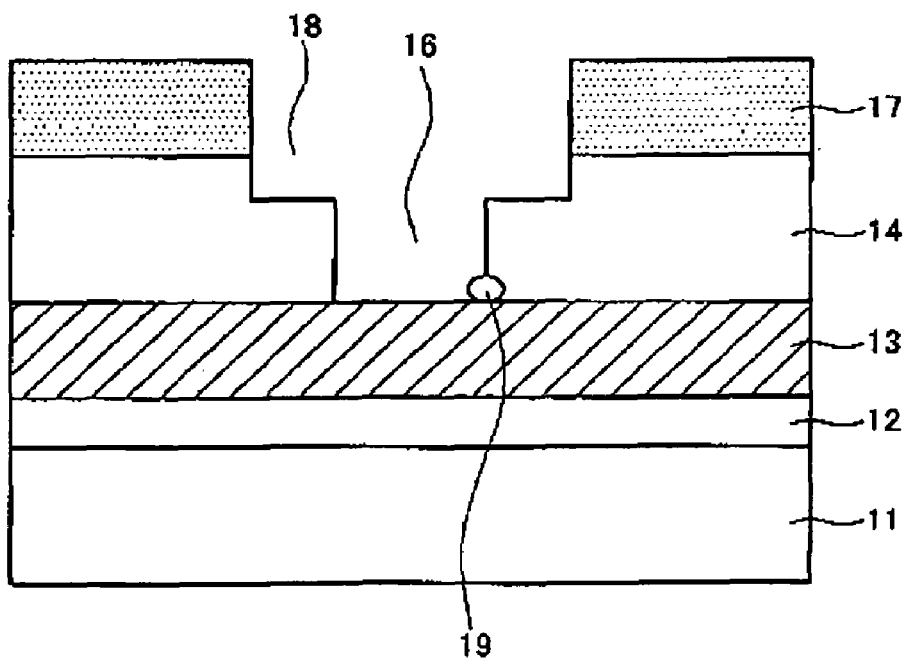
Figure 1C:
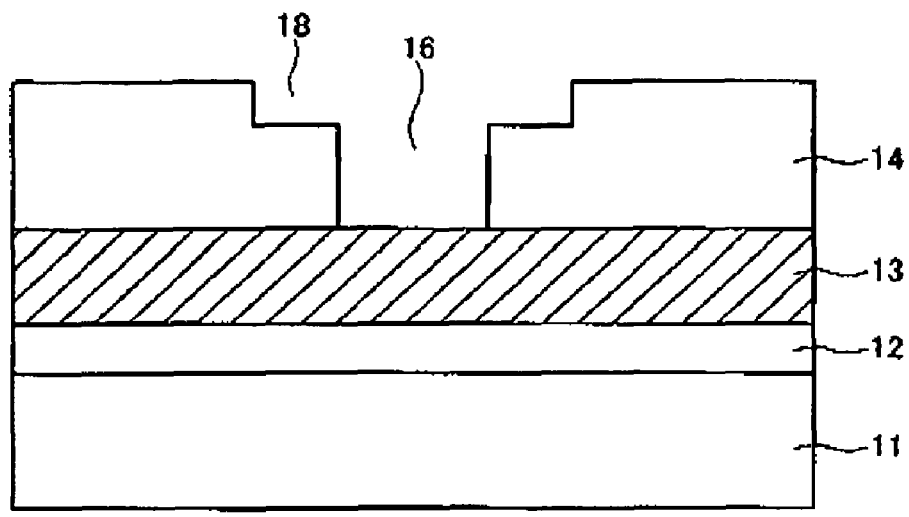
Figure 1D:
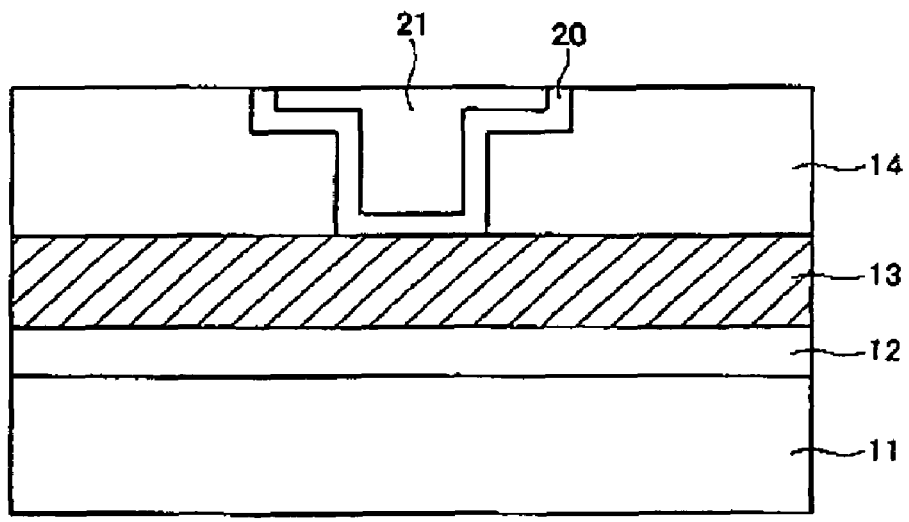

The present invention now will be described more fully hereinafter with reference to the accompanying drawings, in which preferred embodiments of the invention are shown. As those skilled in the art will realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region or substrate is referred to as being "on" another element, it can be directly on the other element or intervening elements may also be present. In contrast, when an element is referred to as being "directly on" another element, there are no intervening elements present.

An exemplary embodiment of the present invention will hereinafter be described in detail with reference to the accompanying drawings.

FIG. 2A to FIG. 2D are cross-sectional views showing principal stages of forming a metal line in a semiconductor device according to an exemplary embodiment of the present invention.

Figure 2A:
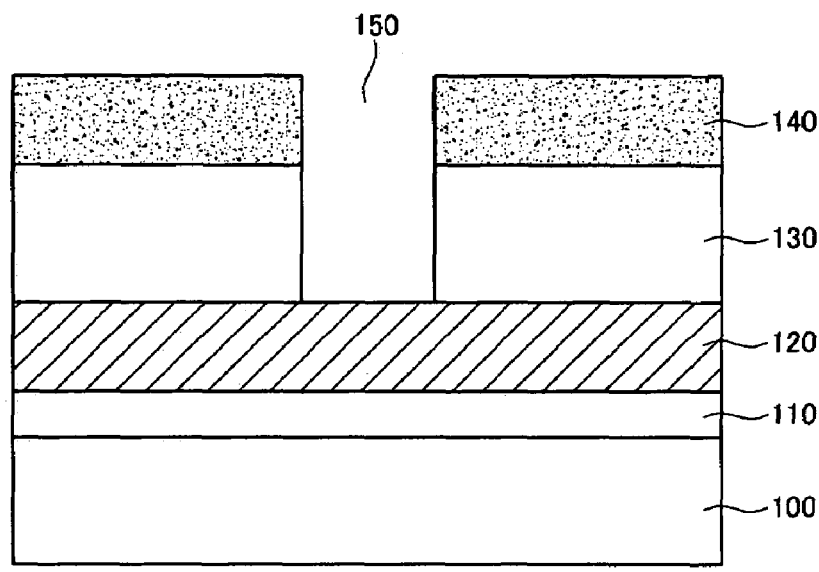
FIG. 2A to FIG. 2D are cross-sectional views showing principal stages of forming a metal line in a semiconductor device according to an exemplary embodiment of the present invention.

As shown in FIG. 2A, a first insulation layer 110 is formed on a semiconductor substrate 100, and a first conductive layer 120 (e.g., a copper layer or an aluminum layer) is formed thereon or therein. Subsequently, the first conductive layer 120 is selectively etched by a photo and etching process (e.g., when first conductive layer 120 comprises aluminum) or is polished (e.g., by CMP when first conductive layer 120 comprises a bulk layer consisting essentially of copper) so as to form a first metal line 120.

A second insulation layer 130 is formed on the entire surface of the semiconductor substrate 100 including the first metal line 120, and a first photosensitive layer 140 is coated on the second insulation layer 130. The second insulation layer 130 may be formed using a material having a low dielectric constant (e.g., a fluorine doped silcate glass [FSG] or a plasma silane [P—$SiH_4$] oxide layer) in order to have a low parasitic capacitance.

Subsequently, the first photosensitive layer 140 is selectively patterned by an exposure and development process so as to define a contact region. The patterned first photosensitive layer 140 is used as an etching mask in selectively etching the second insulation layer 130 to expose a part of the surface of the first metal line 120, thereby forming a via hole 150.

Figure 2B:
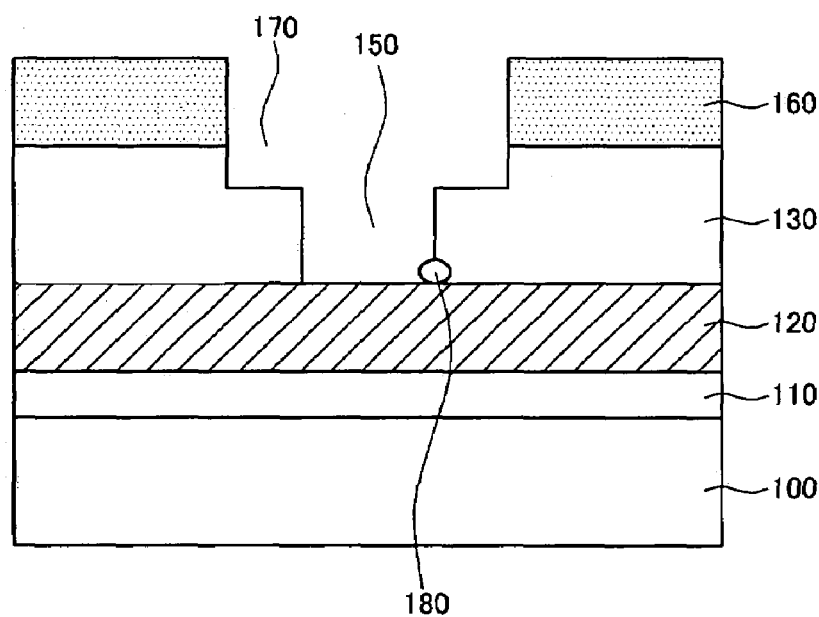

As shown in FIG. 2B, after the first photosensitive layer 140 is removed, a second photosensitive layer 160 is coated on the semiconductor substrate 100 and patterned by an exposing and developing process so as to define a wiring region. Subsequently, the exposed second insulation layer 130 is selectively etched by using the patterned second photosensitive layer 160 as an etching mask so as to form a trench 170 having a predetermined depth. The trench 170 is located on or over the via hole 150 and has a greater width than the via hole 150 so as to form a dual damascene structure.

In forming the trench 170 and the via hole 150, etching residues 180 may be generated.

Figure 2C:
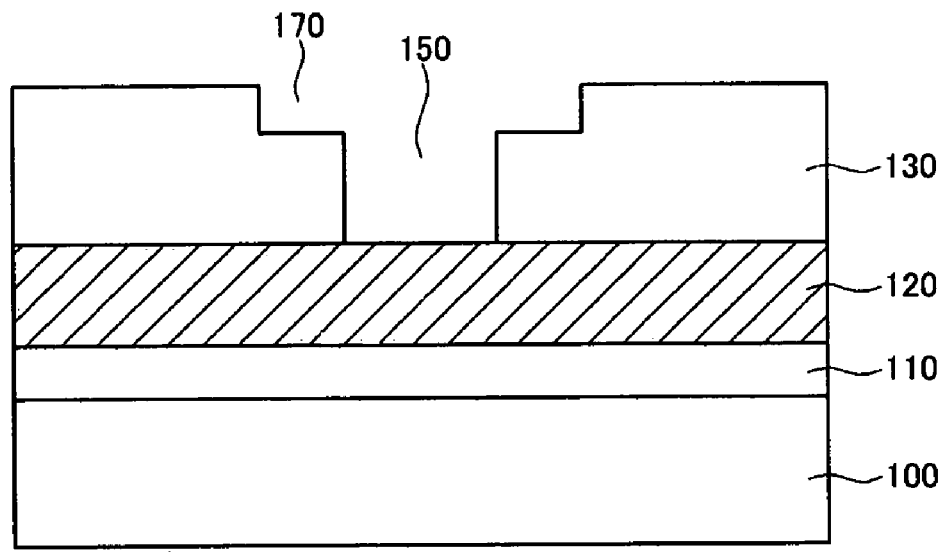

As shown in FIG. 2C, after removing the second photosensitive layer 160, a cleaning process is performed on the semiconductor substrate 100 having the trench 170 and the via hole 150 therein so as to remove the etching residues 180. Before the cleaning process, the semiconductor substrate can be wetted with DI water. By this process, a cleaning effect can be improved by using a rotation method that will be described below.

A first cleaning process is performed using deionized (DI) water or a neutral electrolyte solution on the surface of the semiconductor substrate 100. In various embodiments, the semiconductor substrate 100 is washed or rinsed with DI water or a neutral electrolyte solution, and the semiconductor substrate 100 may be rotated at a rate of up to about 50 RPM. The rotating speed may be increased by steps from a first, relatively low RPM to a second, relatively high RPM. The first cleaning process is performed in order to reduce, erase or eliminate polarity from charges that are locally concentrated in the semiconductor substrate 100 using an electrically neutral material.

Subsequently, after the first cleaning process, a second cleaning process using a cleaning apparatus of a single wafer type is performed on the semiconductor substrate 100. The single wafer type cleaning apparatus removes the etching residues 180 by spraying (e.g., directing a jet or stream of) a gas or cleaning chemical, such as a nitrogen ($N_2$) gas, isopropyl alcohol (IPA) vapor, a combination thereof, etc., on the substrate including the trench 170 and the via hole 150. That is, in the cleaning process according to an exemplary embodiment of the present invention, deionized (DI) water or a neutral electrolyte solution is used for the first cleaning process while rotating at a rate at or under 50 RPM, and a second cleaning process employing a gas stream is performed to remove the etching residues 180.

Figure 2D:
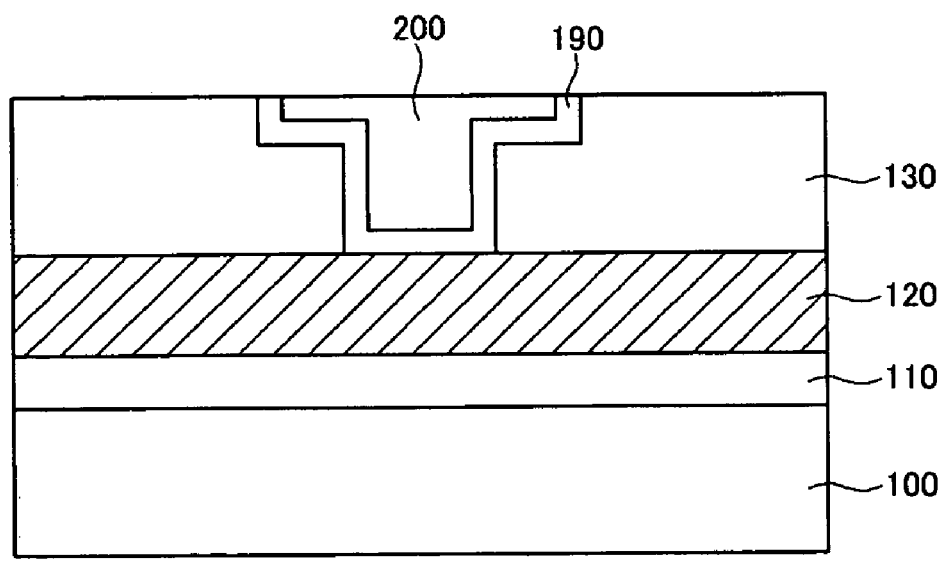

As shown in FIG. 2D, after the first and second cleaning processes, a conductive barrier layer 190 and a second conductive layer 200 (e.g., a copper layer) are sequentially formed over the entire surface of the semiconductor substrate 100, including in the trench 170 and the via hole 150. The barrier layer 190 may comprise TiN, Ta, TaN, $WN_x$, or TiAl(N), and may be formed by depositing the barrier layer 190 using a physical vapor deposition (PVD) method or a chemical vapor deposition (CVD) method to a thickness of from 10 to 1000 Å. The barrier layer 190 prevents diffusion of copper atoms into the second insulation layer 130. The second conductive layer 200 is formed on the barrier layer 190 by an electro-plating method, a PVD method, and/or a CVD method.

For example, when the second conductive layer 200 comprises a copper layer, a copper seed layer is formed on the barrier layer 190 (typically by electro-plating, CVD and/or atomic layer depostion [ALD]), and a copper film is formed thereon. The electroplating method is generally used for forming a stable and pure copper seed layer. In another method, after a diffusion barrier and a copper seed layer is deposited on the substrate, including in the via 150 and trench 170, using equipment having a PVD chamber or a CVD chamber, a copper bulk electroplating process can be performed using copper electroplating equipment. The copper film may also be formed by a metal-organic chemical vapor deposition (MOCVD) method or an electroplating method on the copper seed layer without a vacuum break after forming the copper seed layer. When the copper film is formed by the electroplating method, a copper layer is deposited at a low temperature of −20 to 150° C. without a vacuum break after forming the copper seed layer.

Subsequently, a chemical mechanical polishing (CMP) process is performed on the deposited conductive (e.g., copper) layer 200 and barrier layer 190 (e.g., over the semiconductor substrate 100) in order to remove layers 190 and 200 from outside the trench 170 and leave the second conductive layer 200 and the barrier layer 190 in the via hole 150 and the trench 170.

As described above, the method of forming a metal line in a semiconductor device according to an exemplary embodiment of the present invention may have the following effects.

In a cleaning process for a metal line in a semiconductor device, deionized (DI) water or a neutral electrolyte solution is used for a preliminary cleaning process at a rotating rate at or under 50 RPM, and an additional dry cleaning process with a chemical treatment (e.g., vapor or gas) follows, and thereby an explosion phenomenon of a lower metal line can be reduced or suppressed. Therefore, the product yield of the device and the reliability of the device can be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming metal lines in a semiconductor device, comprising the steps of:
   forming a first metal line on a semiconductor substrate;
   forming an insulation layer on the entire surface of the semiconductor substrate including the first metal line;
   exposing a part of the surface of the first metal line by selectively removing the insulation layer, thereby forming a via hole;
   wetting the semiconductor substrate with deionized water after forming the via hole;
   removing etching residues by performing a wet cleaning process with a neutral electrolyte solution over the semiconductor substrate after wetting the semiconductor substrate with deionized water, while rotating the semiconductor substrate at a rate of greater than 0 to 50 rpm;
   performing a dry cleaning process by spraying or directing a stream of gas comprising nitrogen onto the semiconductor substrate after the wet cleaning step; and
   forming a second metal line that is electrically connected with the first metal line through the via hole.

2. The method of claim 1, wherein the first wet cleaning process further comprises rotating the semiconductor substrate from a first, relatively low RPM to a second, relatively high RPM.

3. The method of claim 1, further comprising forming a trench that is located on or over the via hole and has a greater width than the via hole.

4. The method of claim 1, wherein each of the first metal line and the second metal line comprises copper.

5. The method of claim 1, further comprising forming a barrier layer on the semiconductor substrate and in the via hole before forming the second metal line.

6. The method of claim 1, wherein the stream of gas further comprises isopropyl alcohol.

7. The method of claim 1, wherein the dry cleaning process further is performed in a single wafer cleaning apparatus.

8. The method of claim 1, wherein the dry cleaning process comprises spraying the trench and the via hole.

9. The method of claim 1, wherein the first metal line is formed by selectively etching a first conductive layer.

10. The method of claim 9, wherein selectively etching the first conductive layer comprises a photo process and an etching process.

11. The method of claim 1, further comprising forming an etching mask on the insulating layer comprising a photosensitive layer prior to selectively removing the insulating layer.

12. The method of claim 1, wherein the insulating layer comprises a fluorine doped silicate glass (FSG) or a plasma silane ($P-SiH_4$) oxide layer.

13. The method of claim 1, further comprising forming a conductive barrier layer in the via hole and the trench after performing the dry cleaning process and before forming the second metal line.

14. The method of claim 13, wherein the second metal line comprises a second conductive layer, and forming the second metal line comprises forming the second conductive layer on the conductive barrier layer.

15. The method of claim 13, wherein the barrier layer comprises TiN, Ta, TaN, $WN_x$, or TiAl(N).

16. The method of claim 15, wherein the barrier layer has a thickness of 10 to 1000 Å.

17. The method of claim 1, wherein the first metal line and the second metal line comprise aluminum.

* * * * *